United States Patent [19]

Endo

[11] Patent Number: 5,179,349

[45] Date of Patent: Jan. 12, 1993

[54] START COINCIDENCE CIRCUIT OF ASYNCHRONOUS SIGNALS

[75] Inventor: Tadakazu Endo, Tokyo, Japan

[73] Assignee: Ando Electric Co., Ltd., Tokyo, Japan

[21] Appl. No.: 758,861

[22] Filed: Sep. 12, 1991

[30] Foreign Application Priority Data

Sep. 14, 1990 [JP] Japan .................................. 2-245469

[51] Int. Cl.⁵ .............................................. H03K 5/26
[52] U.S. Cl. ...................................... 328/74; 307/269
[58] Field of Search ...................... 328/72, 74; 307/269

[56] References Cited

U.S. PATENT DOCUMENTS

| | | | |
|---|---|---|---|
| 3,420,989 | 1/1969 | Sapp | 328/72 |
| 4,730,347 | 3/1988 | Paul | 328/74 |
| 4,745,302 | 5/1988 | Hanawa et al. | 307/269 |
| 4,797,574 | 1/1989 | Okubo et al. | 307/269 |
| 5,028,813 | 7/1991 | Hauck et al. | 307/269 |
| 5,058,140 | 10/1991 | Johnson | 328/72 |

Primary Examiner—John S. Heyman
Attorney, Agent, or Firm—Flynn, Thiel, Boutell & Tanis

[57] ABSTRACT

A start coincidence circuit of asynchronous signals has a short route in the synchronous control unit and operable at 10 ns (100 MHz). The start coincidence circuit of asynchronous signal employs a synchronous control unit (4) comprising a gate (11) for receiving a reference signal (6A), an FF (12) for receiving a synchronous signal (5), an FF (13) for receiving the synchronous signal (5) and an output of the gate (11), an FF (14) for receiving an output of the FF (12) and and a reference signal (6B), an FF (15) for receiving an output of the FF (12) and the reference signal (6B), a delay circuit (16) for receiving an output of the FF (13) and a gate (17) for receiving the output of the gate (11), an output of the delay circuit (16) and an output of the FF (15) supplying an output to R terminals of the FF (12), the FF (14) and the FF (15).

1 Claim, 5 Drawing Sheets

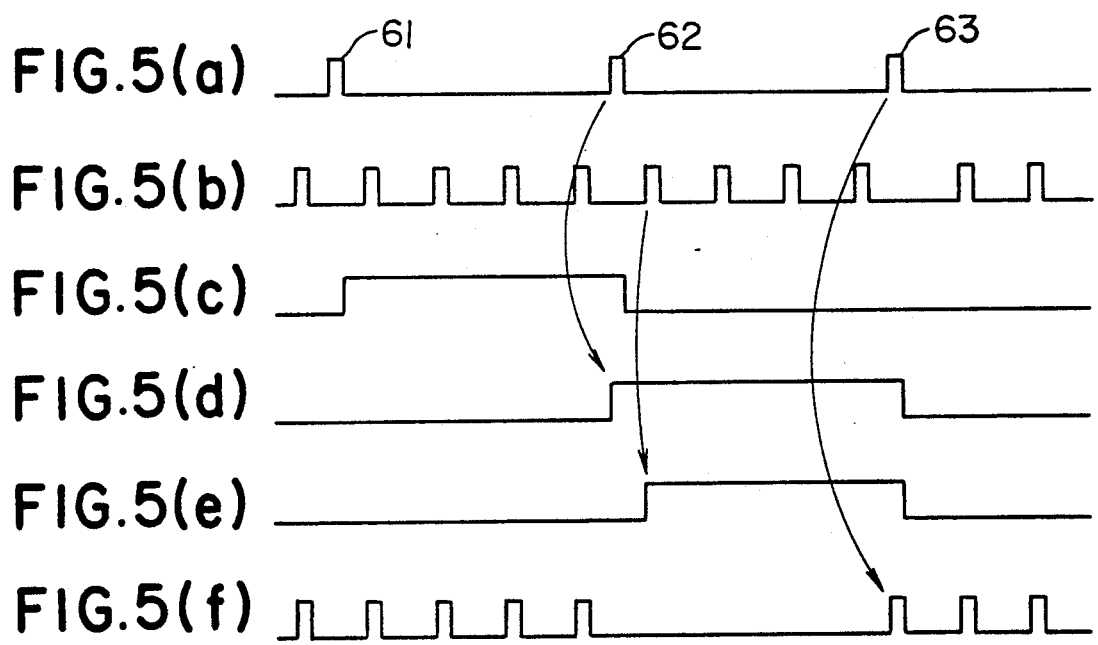

START COINCIDENCE CIRCUIT OF ASYNCHRONOUS SIGNALS

BACKGROUND OF THE INVENTION

1. Field of the Invention

The present invention relates to a start conicidence circuit of asynchronous signals, more particularly to a concidence circuit for coinciding start of two timing generators at an arbitrary point which generators are operated asynchronously when a complete asynchronous test is carried out for an asynchronous memory such as a dual port RAM (hereinafter referred to as two-ports memory).

2. Description of Prior Art

An arrangement of a conventional start coincidence circuit of asnynchronous signals will be described with reference to FIG. 3.

Designated at 1A and 1B are control units, 2 is a synchronous generator, 3A and 3B are signal generators, 4 is a synchronous control unit, 5 is a synchronous signal, 6A and 6B are reference signals, 7A and 7B are memories, 8A and 8B are counters, 9A is a A port and 9B is a B port. The arrangement of FIG. 3 is disclosed in FIG. 1 of Japanese Patent Laid-Open Publication No. 64-59174.

In FIG. 3, the signal generators 3A and 3B having different frequencies are forced to start to issue their reference signals 6A and 6B by the sysnchronous generator 2 and the synchronous control unit 4 at a fixed time. That is, the sysnchrnous signal generator 2 and the synchronous control unit 4 control the control units 1A and 1B, the signal generators 3A and 3B, the memories 7A and 7B and the counters 8A and 8B so that the reference signals A and B which are asynchronous with each other may start at the fixed time.

A circuit of the conventional synchronous control unit 4 will be described with reference to FIG. 4.

Designated at 41 to 45 are gates, 46 and 47 are flip-flops (hereinafter referred to as FFs).

Operations of the circuit in FIGS. 3 and 4 will be described with reference to FIG. 5.

FIG. 5(a) shows a waveform of the reference signal 6A and FIG. 5(b) shows a waveform of the reference signal 6B.

FIG. 5(c) shows a waveform of 5 which outputs a waveform synchronous with the reference signal 6A at two cycles prior to the cycle of the reference signal 6A where the reference signals 6A and 6B are forced to coincide with each other at the fixed time.

FIG. 5(d) shows a waveform of the FF 46 which is output at one cycle behind the synchronous signal 5.

FIG. 5(e) shows a waveform of the FF 47 which is ouput at the time of issuance of the reference signal 6B after the signal 62 of FIG. 5(a) is issued.

FIG. 5(f) shows a waveform which is synchronous with the reference signal 6B before the time of issuance of the signal 63 in FIG. 5(a), but at the time of issuance of the signal 63 in FIG. 5(a), the reference signal 6B coincides with the reference signal 6A since the reference signal 6B is gated by the AND gate 44, namely, at the time when the FF47 issues a high signal.

Figure 3:
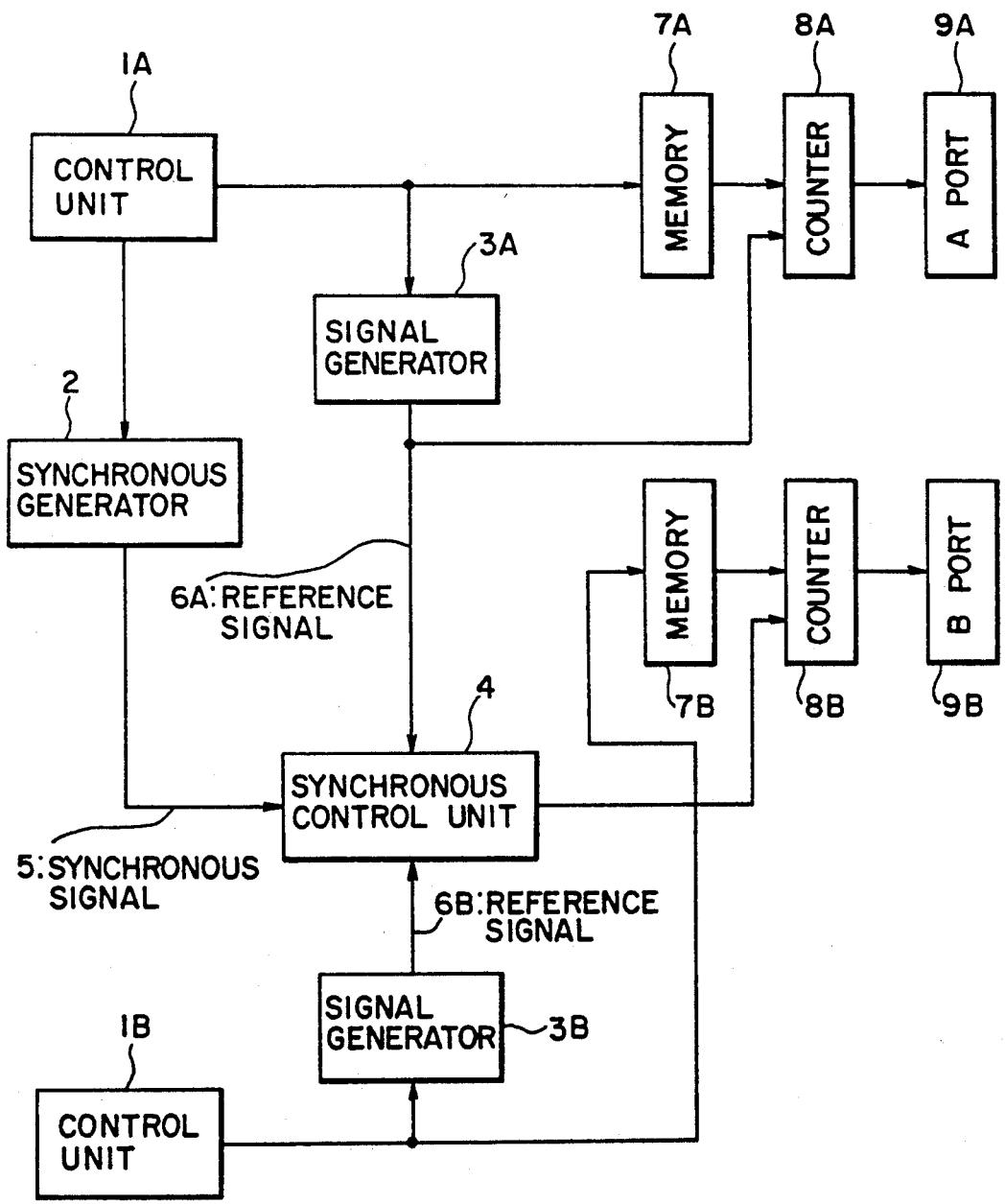

In FIG. 3, the reference signal 6A issued by the signal generator 3A is supplied to the synchronous control unit 4 and is further supplied to the counter 8B by way of the gate 41, the FF 46, the gate 43 and the gate 45. In the gate 45, the reference signal 6A and the signals from the gate 41, the FF 46, the gate 42, the FF 47 and the gate 44 are ORed, consequently the reference signal 6A can be operated only on the order of 16 ns (60 MHz) in the conventional start coincidence circuit of asynchronous signals.

SUMMARY OF THE INVENTION

It is an object of the present invention to provide an arrangement of the circuit having a short route in the synchronous control unit 4 and operable at 10 ns (100 MHz).

To achieve the above object, a start coincidene circuit of asynchronous signal according to a preferred embodiment of the present invention employs a synchronous control unit 4 comprising a gate 11 (FIG. 1) for receiving a reference signal 6A, an FF 12 for receiving a synchronous signal 5, an FF 13 for receiving the synchronous signal 5 and an output of the gate 11, an FF 14 for receiving an output of the FF 12 and a reference signal 6B, an FF 15 for receiving an output of the FF 12 and the reference signal 6B, a delay circuit 16 for receiving an output of the FF 13 and a gate 17 for receiving the output of the gate 11, an output of the delay circuit 16 and an output of the FF 15 supplying an output to R terminals of the FF 12, the FF 14 and the FF 15.

BRIEF DESCRIPTION OF THE INVENTION

Figure 1:
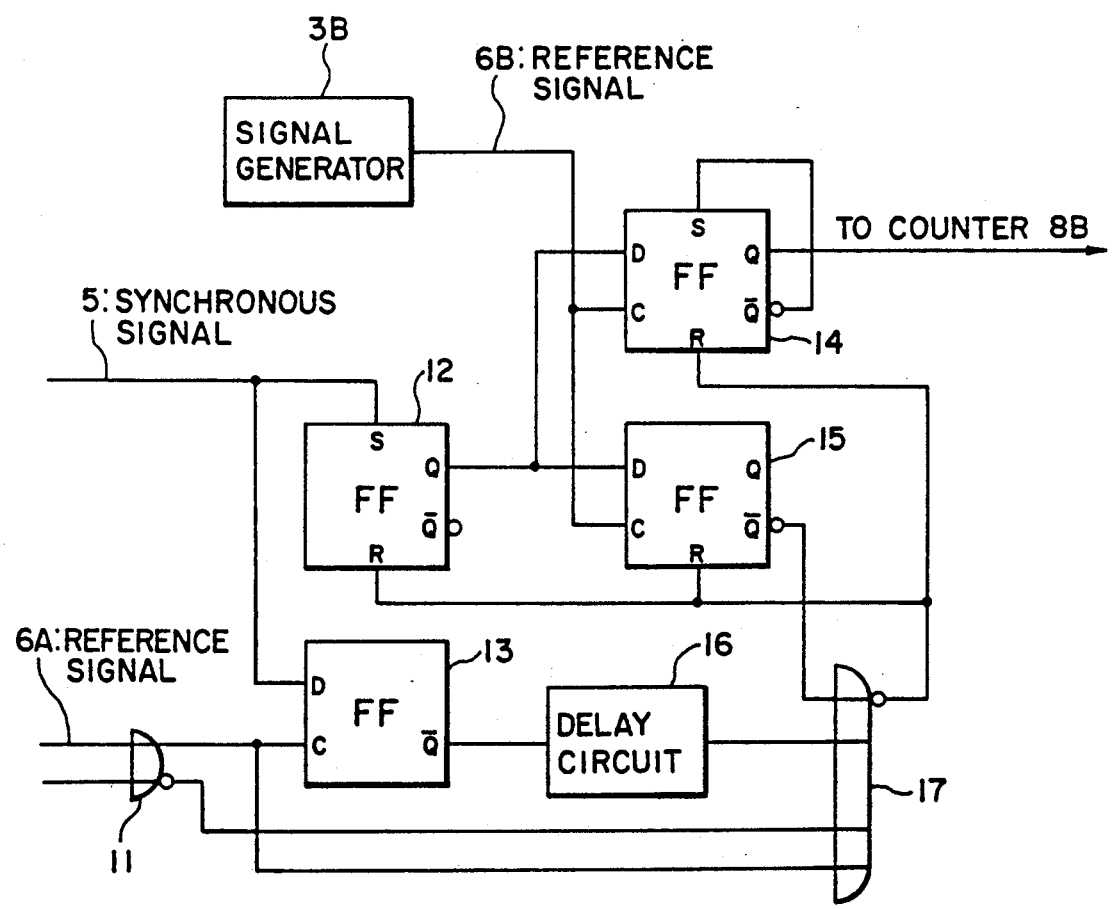
Figure 2:
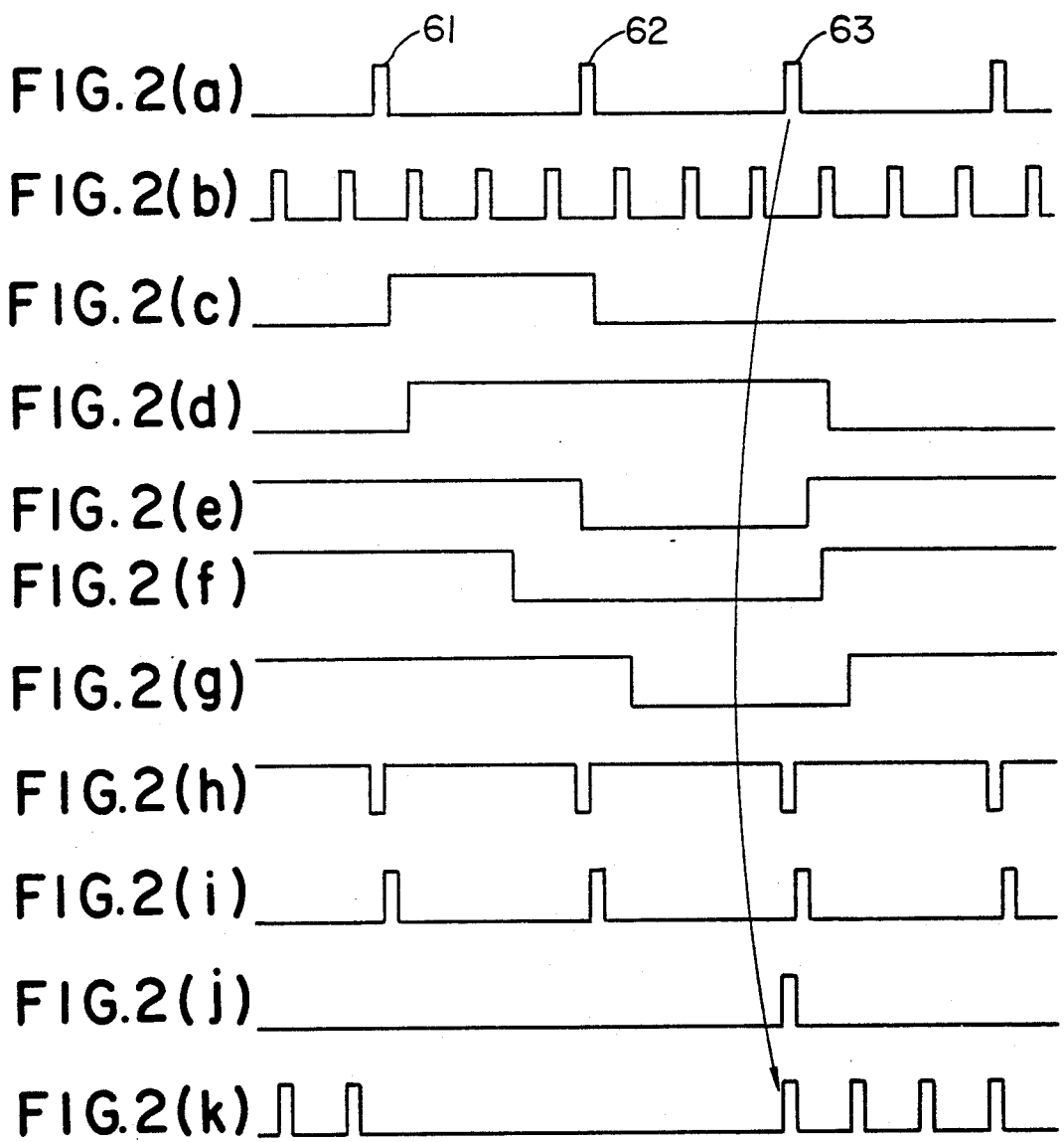
Figure 4:
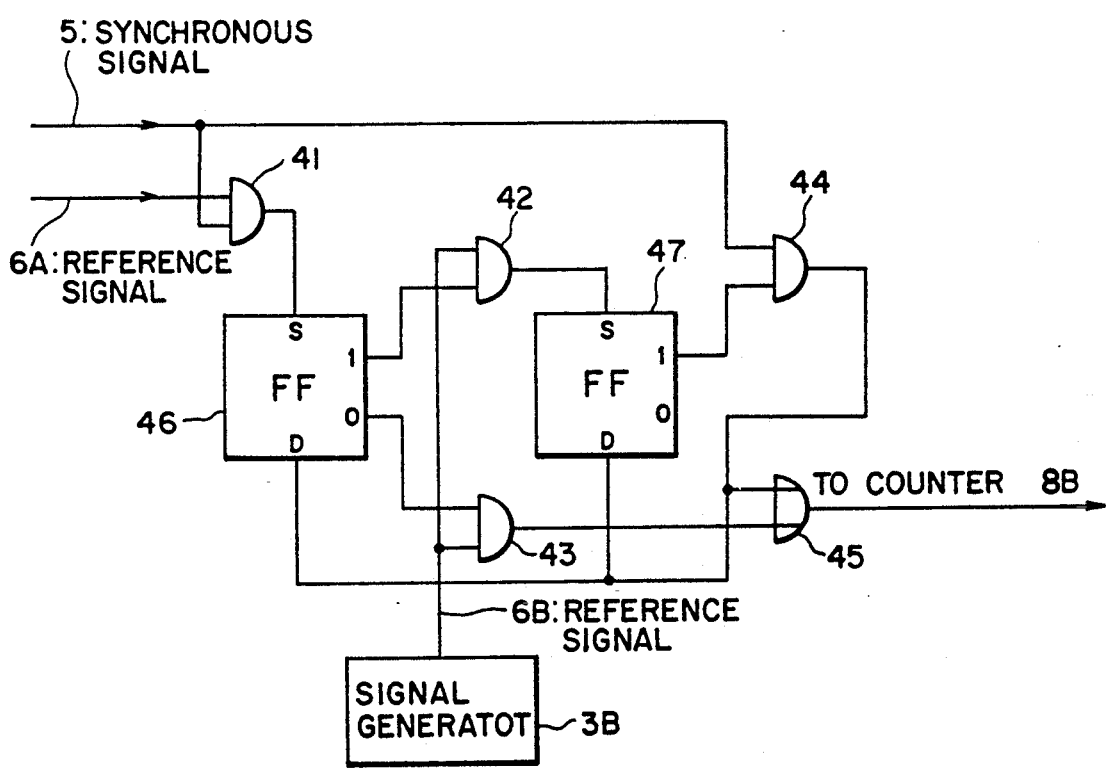

FIG. 1 is a circuit diagram showing a synchronus control unit 4 according to a preferred embodiment of the present invention;

FIG. 2 is waveforms as illustrated in FIG. 1;

FIG. 3 is a view showing an arrangement of a start coincidence circuit of a conventional asynchronous signal;

FIG. 4 is a circuit diagram of a conventional synchronous control unit 4;

FIGS. 5(a) to 5(f) are views showing waveforms as illustrated in FIGS. 3 and 4.

DESCRIPTION OF THE PREFERRED EMBODIMENT

An arrangement of the circuit of the sysnchronous control unit 4 according to the preferred embodiment of the present invention will be described with reference to FIG. 1.

Designated at 11 is a gate, 12 to 15 are FFs, 16 is a delay circuit, 17 is a gate and other components are the same as those of the prior art as illustrated in FIG. 4. The synchronous signal 5 is supplied to an S terminal of the FF 12 and a D terminal of the FF 13, and the reference signal 6A is supplied to the gate 11. A Q output of the FF 12 is supplied to D terminals of the FFs 14 and 15 while an output of the gate 11 is supplied to a C terminal of the FF 13 and the gate 17. An output (the reference signal 6B) of the signal generator 3B is supplied to C terminals of the FFs 14 and 15 while an inversed Q output of the FF 15 is supplied to the gate 17. An output of the gate 17 is supplied to R terminals of the FFs 12, 13 and 14 while a Q output of the FF 14 is supplied to the counter 8B.

Inasmuch as the signal can be supplied to the counter 8B by way of the gate 11, the gate 17 and the FF 14 which forms a shorter route than that of the conventional arrangement of the circuit of the sysnchronous control unit 4, the signal can be processed at high speed in response to the simplicity of the circuit.

FIG. 2(a) is a waveform of the reference signal 6A and FIG. 2(b) is a waveform of the reference signal 6B and FIG. 6(c) shows a waveform of the synchronous signal 5.

The synchronous signal 5 is to be output between the reference signals 61 and 62 as illustrated in FIG. 2(a) when the reference signal 6A is forced to coincide with the reference signal 6B at the time when the reference signal 63 is issued.

FIG. 2(d) shows a waveform of the Q output when the synchronous signal 5 in FIG. 2(c) is supplied to the FF 12. The output of the FF 14 is masked by the output waveform of the FF 12.

FIG. 2(e) shows a waveform of the output of the FF 13 when the synchronous signal 5 in FIG. 2(c) and the reference signal 6A in FIG. 2(a) are supplied to the FF 13. FIG. 2(f) shows a waveform of the output of the FF 15 when the reference signal 6B in FIG. 2(b) and the output of the FF 12 in FIG. 2(d) are supplied to the FF 12.

FIG. 2(g) shows a waveform produced by delaying the signal by the delay circuit 16 when the waveform of the output of the FF 13 is supplied to the gate 17. FIGS. 2(h) and 2(i) show waveforms of "H" signal and "L" signal produced by the reference signal 6A after passing through the gate 11.

FIG. 2(j) shows a waveform of "H" signal produced by
the gate 17 when the waveforms in FIGS. 2 (f) to (i) are supplied into the gate 17 are all "L" signal.

If the output of the gate 17 of the waveform in FIG. 2(j) is supplied to the FF 14, it is possible to coincide the reference signal 6A with the reference signal 6B at the position of the reference signal 63.

FIG. 2(k) is a waveform produced at an output of the FF 14.

With such an arrangement of the start coincidence circuit of asynchronous signals, the numbers of the components are reduced compared with the conventional start coincidence circuit so that the start of the reference signal 6A having substantially 100 MHz which is asynchronous with the reference signal 6B can be coincident with the start of the reference signal 6B i.e., both the reference signals 6A and 6B can be synchronously issued. As a result, it is possible to test the 2 ports memory having the high operation speed with asynchronous state.

What is claimed is:

1. A start coincidence circuit of asynchronous signal comprising a first signal generator for producing a first reference signal, a second signal generator for producing a second reference signal, a synchronous control unit receiving the first reference signal, the second reference signal and the synchronous signal for producing a third reference signal to coincide with the start of the first and the second reference signals, wherein the start coincidence circuit of asynchronous signal further includes:

a first gate for receiving the first reference signal;
a first flip-flop for receiving the synchronous signal;
a second flip-flop for receiving the synchronous signal and an output of the first gate;
a third flip-flop for receiving an output of the first flip-flop and the second reference signal;
a fourth flip-flop for receiving an output of the first flip-flop and the second reference signal and for outputting the third reference signal;
a delay circuit for receiving an output of the second flip-flop and a second gate for receiving the output of the first gate, an output of the delay circuit and an output of the third flip-flop and for supplying an output to R terminals of the first-flop, the third flip-flop and the fourth flip-flop.

* * * * *